(12) United States Patent
Lung

(10) Patent No.: US 8,064,248 B2
(45) Date of Patent: Nov. 22, 2011

(54) 2T2R-1T1R MIX MODE PHASE CHANGE MEMORY ARRAY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 237 days.

(21) Appl. No.: 12/561,556

(22) Filed: Sep. 17, 2009

(65) Prior Publication Data

US 2011/0063902 A1  Mar. 17, 2011

(51) Int. Cl.
*G11C 11/00* (2006.01)

(52) U.S. Cl. .................. 365/163; 365/189.15; 365/148

(58) Field of Classification Search .............. 365/148, 365/163, 189.15, 189.14, 189.07
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |

(Continued)

FOREIGN PATENT DOCUMENTS

WO    2004025659 A1    3/2004

OTHER PUBLICATIONS

"Magnetic Bit Boost," www.sciencenews.org, Dec. 18 & 25, 2004, p. 389, vol. 166.

(Continued)

*Primary Examiner* — Gene N Auduong
(74) *Attorney, Agent, or Firm* — Haynes Beffel & Wolfeld LLP

(57) ABSTRACT

A memory device as described herein includes an array of programmable resistance memory cells. The memory device further includes sense circuitry having a dual memory cell (2T-2R) mode to read a data value stored in a pair of memory cells in the array based on a difference in resistance between a first memory cell in the pair and a second memory cell in the pair. The sense circuitry also has a single memory cell (1T-1R) mode to read a data value in a particular memory cell in the array based on the resistance of the particular memory cell.

20 Claims, 8 Drawing Sheets

U.S. PATENT DOCUMENTS

| | | | |
|---|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |

| | | | | | | |
|---|---|---|---|---|---|---|
| 7,248,494 | B2 | 7/2007 | Oh et al. | 2006/0038221 A1 | 2/2006 | Lee et al. |
| 7,251,157 | B2 | 7/2007 | Osada et al. | 2006/0066156 A1 | 3/2006 | Dong et al. |
| 7,253,429 | B2 | 8/2007 | Klersy et al. | 2006/0073642 A1 | 4/2006 | Yeh et al. |
| 7,254,059 | B2 | 8/2007 | Li et al. | 2006/0091476 A1 | 5/2006 | Pinnow et al. |
| 7,262,502 | B2 | 8/2007 | Chang | 2006/0094154 A1 | 5/2006 | Lung |
| 7,269,052 | B2 | 9/2007 | Segal et al. | 2006/0108667 A1 | 5/2006 | Lung |
| 7,277,317 | B2 | 10/2007 | Le Phan et al. | 2006/0110878 A1 | 5/2006 | Lung et al. |
| 7,291,556 | B2 | 11/2007 | Choi et al. | 2006/0110888 A1 | 5/2006 | Cho et al. |
| 7,309,630 | B2 | 12/2007 | Fan et al. | 2006/0113520 A1 | 6/2006 | Yamamoto et al. |
| 7,314,776 | B2 | 1/2008 | Johnson et al. | 2006/0113521 A1 | 6/2006 | Lung |
| 7,317,201 | B2 | 1/2008 | Gutsche et al. | 2006/0118913 A1 | 6/2006 | Yi et al. |
| 7,321,130 | B2 | 1/2008 | Lung et al. | 2006/0124916 A1 | 6/2006 | Lung |
| 7,323,708 | B2 | 1/2008 | Lee et al. | 2006/0126395 A1 | 6/2006 | Chen et al. |
| 7,323,734 | B2 | 1/2008 | Ha et al. | 2006/0131555 A1 | 6/2006 | Liu et al. |
| 7,332,370 | B2 | 2/2008 | Chang et al. | 2006/0138467 A1 | 6/2006 | Lung |
| 7,336,526 | B2 | 2/2008 | Osada et al. | 2006/0154185 A1 | 7/2006 | Ho et al. |
| 7,351,648 | B2 | 4/2008 | Furukawa et al. | 2006/0157680 A1 | 7/2006 | Takaura et al. |
| 7,359,231 | B2 | 4/2008 | Venkataraman et al. | 2006/0157681 A1 | 7/2006 | Chen et al. |
| 7,364,935 | B2 | 4/2008 | Lung et al. | 2006/0163554 A1 | 7/2006 | Lankhorst et al. |
| 7,365,385 | B2 | 4/2008 | Abbott | 2006/0169968 A1 | 8/2006 | Happ |
| 7,379,328 | B2 | 5/2008 | Osada et al. | 2006/0172067 A1 | 8/2006 | Ovshinsky et al. |
| 7,385,235 | B2 | 6/2008 | Lung et al. | 2006/0175599 A1 | 8/2006 | Happ |
| 7,388,273 | B2 | 6/2008 | Burr et al. | 2006/0192193 A1 | 8/2006 | Lee et al. |
| 7,394,088 | B2 | 7/2008 | Lung | 2006/0198183 A1 | 9/2006 | Kawahara et al. |
| 7,397,060 | B2 | 7/2008 | Lung | 2006/0202245 A1 | 9/2006 | Zuliani et al. |
| 7,400,522 | B2 | 7/2008 | Toda et al. | 2006/0205108 A1 | 9/2006 | Maimon et al. |
| 7,423,300 | B2 | 9/2008 | Lung et al. | 2006/0211165 A1 | 9/2006 | Hwang et al. |
| 7,426,134 | B2 | 9/2008 | Happ et al. | 2006/0226409 A1 | 10/2006 | Burr et al. |
| 7,440,308 | B2 | 10/2008 | Jeong et al. | 2006/0234138 A1 | 10/2006 | Fehlhaber et al. |
| 7,449,710 | B2 | 11/2008 | Lung | 2006/0237756 A1 | 10/2006 | Park et al. |
| 7,473,576 | B2 | 1/2009 | Lung | 2006/0245236 A1 | 11/2006 | Zaidi |
| 7,479,649 | B2 | 1/2009 | Lung | 2006/0250885 A1 | 11/2006 | Cho et al. |
| 7,485,891 | B2 | 2/2009 | Hamann et al. | 2006/0261392 A1 | 11/2006 | Lee et al. |
| 7,502,252 | B2 | 3/2009 | Fuji et al. | 2006/0266993 A1 | 11/2006 | Suh et al. |
| 7,507,986 | B2 | 3/2009 | Lung | 2006/0284157 A1 | 12/2006 | Chen et al. |
| 7,514,334 | B2 | 4/2009 | Chen et al. | 2006/0284158 A1 | 12/2006 | Lung et al. |
| 7,514,705 | B2 | 4/2009 | Breitwisch et al. | 2006/0284214 A1 | 12/2006 | Chen |
| 7,515,461 | B2 | 4/2009 | Happ et al. | 2006/0284279 A1 | 12/2006 | Lung et al. |
| 7,569,844 | B2 | 8/2009 | Lung | 2006/0286709 A1 | 12/2006 | Lung et al. |
| 7,672,179 | B1 * | 3/2010 | Gorla et al. .................... 365/198 | 2006/0286743 A1 | 12/2006 | Lung et al. |
| 7,683,360 | B2 | 3/2010 | Chen et al. | 2006/0289847 A1 | 12/2006 | Dodge |
| 7,688,619 | B2 | 3/2010 | Lung et al. | 2006/0289848 A1 | 12/2006 | Dennison |
| 7,696,503 | B2 | 4/2010 | Lung et al. | 2007/0007613 A1 | 1/2007 | Wang et al. |
| 7,701,759 | B2 | 4/2010 | Lung et al. | 2007/0008786 A1 | 1/2007 | Scheuerlein |
| 2002/0017701 | A1 | 2/2002 | Klersy et al. | 2007/0030721 A1 | 2/2007 | Segal et al. |
| 2002/0070457 | A1 | 6/2002 | Sun et al. | 2007/0037101 A1 | 2/2007 | Morioka |
| 2002/0113273 | A1 | 8/2002 | Hwang et al. | 2007/0040159 A1 | 2/2007 | Wang |
| 2002/0168852 | A1 | 11/2002 | Harshfield et al. | 2007/0051936 A1 | 3/2007 | Pellizzer et al. |
| 2003/0072195 | A1 | 4/2003 | Mikolajick | 2007/0096162 A1 | 5/2007 | Happ et al. |
| 2003/0095426 | A1 | 5/2003 | Hush et al. | 2007/0096248 A1 | 5/2007 | Philipp et al. |
| 2003/0116794 | A1 | 6/2003 | Lowrey | 2007/0108077 A1 | 5/2007 | Lung et al. |
| 2003/0186481 | A1 | 10/2003 | Lung | 2007/0108429 A1 | 5/2007 | Lung |
| 2004/0026686 | A1 | 2/2004 | Lung | 2007/0108430 A1 | 5/2007 | Lung |
| 2004/0051094 | A1 | 3/2004 | Ooishi | 2007/0108431 A1 | 5/2007 | Chen et al. |
| 2004/0113137 | A1 | 6/2004 | Lowrey | 2007/0109836 A1 | 5/2007 | Lung |
| 2004/0165422 | A1 | 8/2004 | Hideki et al. | 2007/0109843 A1 | 5/2007 | Lung et al. |
| 2004/0246129 | A1 * | 12/2004 | Goggin .................... 340/539.23 | 2007/0111429 A1 | 5/2007 | Lung |
| 2004/0248339 | A1 | 12/2004 | Lung | 2007/0115794 A1 | 5/2007 | Lung |
| 2004/0256610 | A1 | 12/2004 | Lung | 2007/0117315 A1 | 5/2007 | Lai et al. |
| 2005/0018526 | A1 | 1/2005 | Lee | 2007/0120104 A1 | 5/2007 | Ahn et al. |
| 2005/0029502 | A1 | 2/2005 | Hudgens | 2007/0121363 A1 | 5/2007 | Lung |
| 2005/0029587 | A1 | 2/2005 | Harshfield | 2007/0121374 A1 | 5/2007 | Lung et al. |
| 2005/0052904 | A1 | 3/2005 | Cho et al. | 2007/0126040 A1 | 6/2007 | Lung |
| 2005/0062087 | A1 | 3/2005 | Chen et al. | 2007/0131922 A1 | 6/2007 | Lung |
| 2005/0093022 | A1 | 5/2005 | Lung | 2007/0138458 A1 | 6/2007 | Lung |
| 2005/0127349 | A1 | 6/2005 | Horak et al. | 2007/0147105 A1 | 6/2007 | Lung et al. |
| 2005/0141261 | A1 | 6/2005 | Ahn | 2007/0153563 A1 | 7/2007 | Nirschl |
| 2005/0145984 | A1 | 7/2005 | Chen et al. | 2007/0154847 A1 | 7/2007 | Chen et al. |
| 2005/0167656 | A1 | 8/2005 | Sun et al. | 2007/0155172 A1 | 7/2007 | Lai et al. |
| 2005/0191804 | A1 | 9/2005 | Lai et al. | 2007/0156949 A1 | 7/2007 | Rudelic et al. |
| 2005/0195633 | A1 | 9/2005 | Choi et al. | 2007/0158632 A1 | 7/2007 | Ho |
| 2005/0201182 | A1 | 9/2005 | Osada et al. | 2007/0158633 A1 | 7/2007 | Lai et al. |
| 2005/0212024 | A1 | 9/2005 | Happ | 2007/0158645 A1 | 7/2007 | Lung |
| 2005/0212026 | A1 | 9/2005 | Chung et al. | 2007/0158690 A1 | 7/2007 | Ho et al. |
| 2005/0215009 | A1 | 9/2005 | Cho | 2007/0158862 A1 | 7/2007 | Lung |
| 2005/0263829 | A1 | 12/2005 | Song et al. | 2007/0161186 A1 | 7/2007 | Ho |
| 2005/0270832 | A1 | 12/2005 | Chu et al. | 2007/0170881 A1 | 7/2007 | Noh et al. |
| 2006/0006472 | A1 | 1/2006 | Jiang | 2007/0173019 A1 | 7/2007 | Ho et al. |
| 2006/0018156 | A1 | 1/2006 | Happ | 2007/0173063 A1 | 7/2007 | Lung |

| | | |
|---|---|---|
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166600 A1 | 7/2009 | Park et al. |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='non-volatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI ERA-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

2T2R-1T1R MIX MODE PHASE CHANGE MEMORY ARRAY

PARTIES TO A JOINT RESEARCH AGREEMENT

International Business Machines Corporation, a New York corporation, and Macronix International Corporation, Ltd, a Taiwan corporation, are parties to a Joint Research Agreement.

BACKGROUND OF THE INVENTION

1. Field of the Invention

The present invention relates to memory devices based on programmable resistance materials memory materials, including chalcogenide based materials and other phase change materials, and methods for operating such devices.

2. Description of Related Art

In general, system-on-a-chip (SOC) technology is the integration of multiple subsystems of an electronic system within a single integrated circuit, and may contain digital, analog, mixed-signal, and radio-frequency functions. The various types of subsystems that may be integrated within the integrated circuit include microprocessor and microcontroller cores, digital signal processors (DSPs), configurable logic units, memory blocks, timing sources, external interfaces, and power management circuits, among others. An SOC consists of both the hardware described above, as well as the software that controls the subsystems. The term "system-on-a-chip" may be used to describe complex application-specific integrated circuits (ASIC), where many functions previously achieved by combining integrated circuits on a board are not provided by one single integrated circuit. This level of integration greatly reduces the size and power consumption of the system, while generally also reducing manufacturing costs.

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

It has been observed that some phase change memory cells in the reset state experience a decrease in resistance over time to below a threshold value used to distinguish between the reset and set states, resulting in data retention problems and bit errors for those memory cells. For example, a memory cell in which an active region has been reset to a generally amorphous phase may over time develop a distribution of crystalline regions within the active regions. If these crystalline regions connect to form a low resistance path through the active region, when the memory cell is read a lower resistance state will be detected and result in a data error. See, Gleixner, "Phase Change Memory Reliability", 22nd NVSMW, 2007. Similar issues can arise in other types of programmable resistance materials.

One attempt at addressing the data retention problems caused by the decrease in resistance over time is to maintain a relatively large margin between the set and reset states. However, in phase change memory, a relatively large margin typically requires a slow set operation and high reset current in order to obtain the large difference in resistance between the set and reset states. The relatively slow set speed and a high reset current limit the operational speed of the device, restricting the use of phase change based memory circuits as high speed memory.

Thus, circuits employing phase change based memory circuits typically also include other types of memory circuits in order to fulfill the memory performance requirements for the various functions of the integrated circuit. These different types of memory circuits typically include SRAM or DRAM memory circuits in order to provide high access speed memory for the integrated circuit. However, integration of different types of memory circuits for the various memory applications can be difficult and result in highly complex designs.

It is therefore desirable to provide programmable resistance memory based devices and methods for operating which address different memory performance requirements, including applications requiring high speed operation, while also addressing the issue of design integration.

SUMMARY

A memory device as described herein includes an array of programmable resistance memory cells such as phase change memory cells. The memory device includes sense circuitry having a dual mode (2T-2R) to read a data value stored in a pair of memory cells in the array based on a difference in resistance between a first memory cell in the pair and a second memory cell in the pair. The sense circuitry also has a single mode (1T-1R) to read a data value in a particular memory cell in the array based on the resistance of the particular memory cell.

The memory device includes bias circuitry having single and dual modes to establish higher and lower resistance states in the memory cells in the array to store data values. The bias circuitry applies bias arrangements such as read, program, erase, erase verify, program verify and refresh to the memory cells for these two modes of operation.

In the dual mode a data value is stored in the pair by setting one of the memory cells in the pair to a lower resistance state and setting the resistance of the other memory cell to a higher resistance state.

The difference between higher and lower resistance states of the dual mode can be less than the difference between high and low resistance states of the single memory cell mode. For example, the higher resistance state for the dual mode can be a "partial reset" or "partial set" state having a minimum resistance less than a minimum resistance state of the higher resistance state for the single mode, while the low resistance states of the single and dual modes in some embodiments the same.

The single mode read margin, that is the difference between the single mode low and high resistance states, is relatively large in order to reliably distinguish between the single mode low and high resistance states by comparing the resistance of a particular memory cell with a predetermined reference to provide excellent nonvolatile data retention performance. The relatively large single mode read margin can therefore address issues such as variations in materials, manufacturing processes, and also the operating environment which lead to different programming characteristics including variations in the resistance of the memory material associated with each data value in an array of memory cells.

The difference between the dual mode low and high resistance states can be smaller than the single mode read margin. As a result, the time and/or energy needed to cause a transition between the dual mode low and high resistance states to store a data value can be less than the energy needed to cause a transition between the single mode low and high resistance states to store a data value. Thus, the dual memory cell mode enables high speed operation of memory cells in the array using small programming current.

The single and dual modes can provide different operational characteristics such as switching speed, operational current, and data retention within the same memory cells of an array. As a result, the array can address the different memory performance requirements demanded by various functions of an integrated circuit. Some of the memory cells in the array may be operated in the single mode while others are concurrently operated in a dual mode.

Methods for operating memory cells in the single and dual modes are also described herein.

Other aspects and advantages of the present invention can be seen on review of the drawings, the detailed description, and the claims which follow.

DETAILED DESCRIPTION

Figure 1:
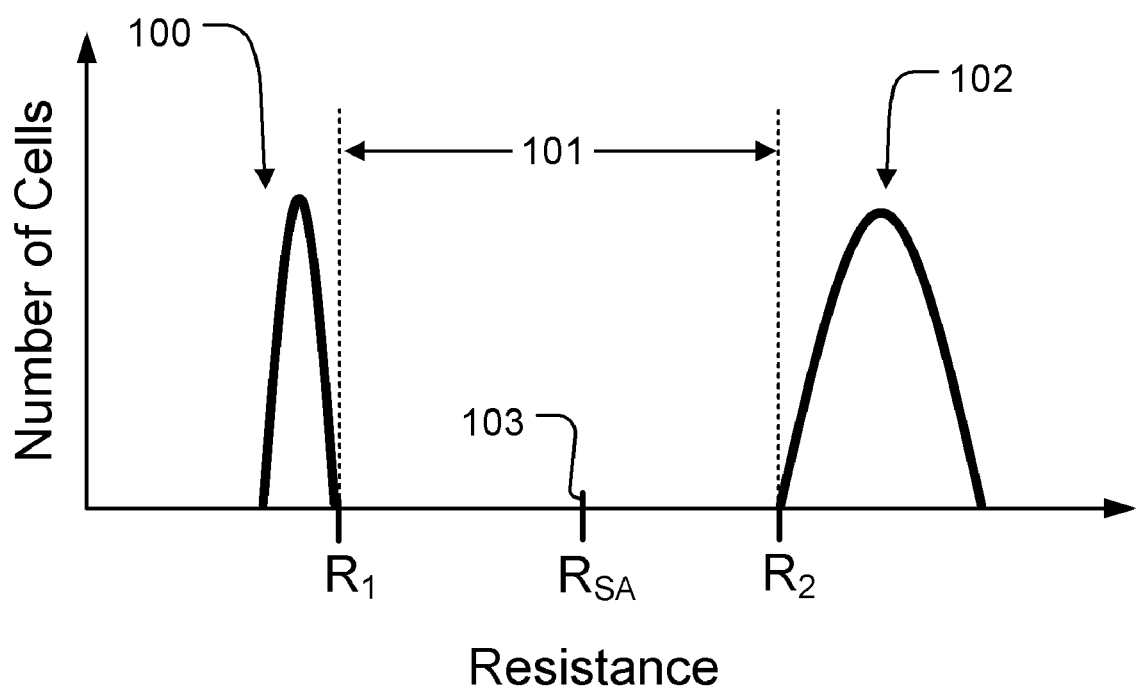
FIG. 1 is an example distribution of the resistance for a number of memory cells each comprising a phase change memory element having one of two states.

In phase change memory, data is stored by causing transitions in an active region of the phase change material between amorphous and crystalline phases. FIG. 1 is a graph of resistance distribution for memory states in memory cells storing a single bit of data, including a lower resistance set (programmed) state 100 corresponding to a primarily crystalline phase in the active region of the cell, and a high resistance (erased) state 102 corresponding to a primarily amorphous phase in the active region of the cell. For reliable operation, the resistance distributions must have non-overlapping resistance ranges.

The change from the high resistance state 102 to the lower resistance state 100 is generally a lower current operation in which current heats the phase change material above a transition temperature to cause transition from the amorphous to the crystalline phase. The change from the low resistance state 100 to the high resistance state 102 is generally a higher current operation, which includes a short high current density pulse to melt or breakdown the crystalline structure, after which the phase change material cools quickly, quenching the phase change process and allowing at least a portion of the phase change material to stabilize in the amorphous phase.

The difference between the highest resistance $R_1$ of the lower resistance state 100 and the lower resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101. In multiple-bit-per-cell embodiments, there are more than two resistance states, with read margins between them.

In order to reliably distinguish between the high resistance state 102 and the low resistance state 100, it is important to maintain a relatively large read margin 101. However, in order to meet high speed memory requirements, such as those typically required of DRAM and SRAM memory, phase change based memory circuits must operate at high set and reset operational speeds and use less operational current. These high set and reset speeds and low operational current act to reduce the difference in resistance between the states 100 and 102. However, a small read margin 101 can result in data retention issues and bit errors because of drift in resistance as the active region composition shifts from amorphous to crystalline phase, or vice versa, due to environmental conditions to which the device is exposed.

Figure 2A:
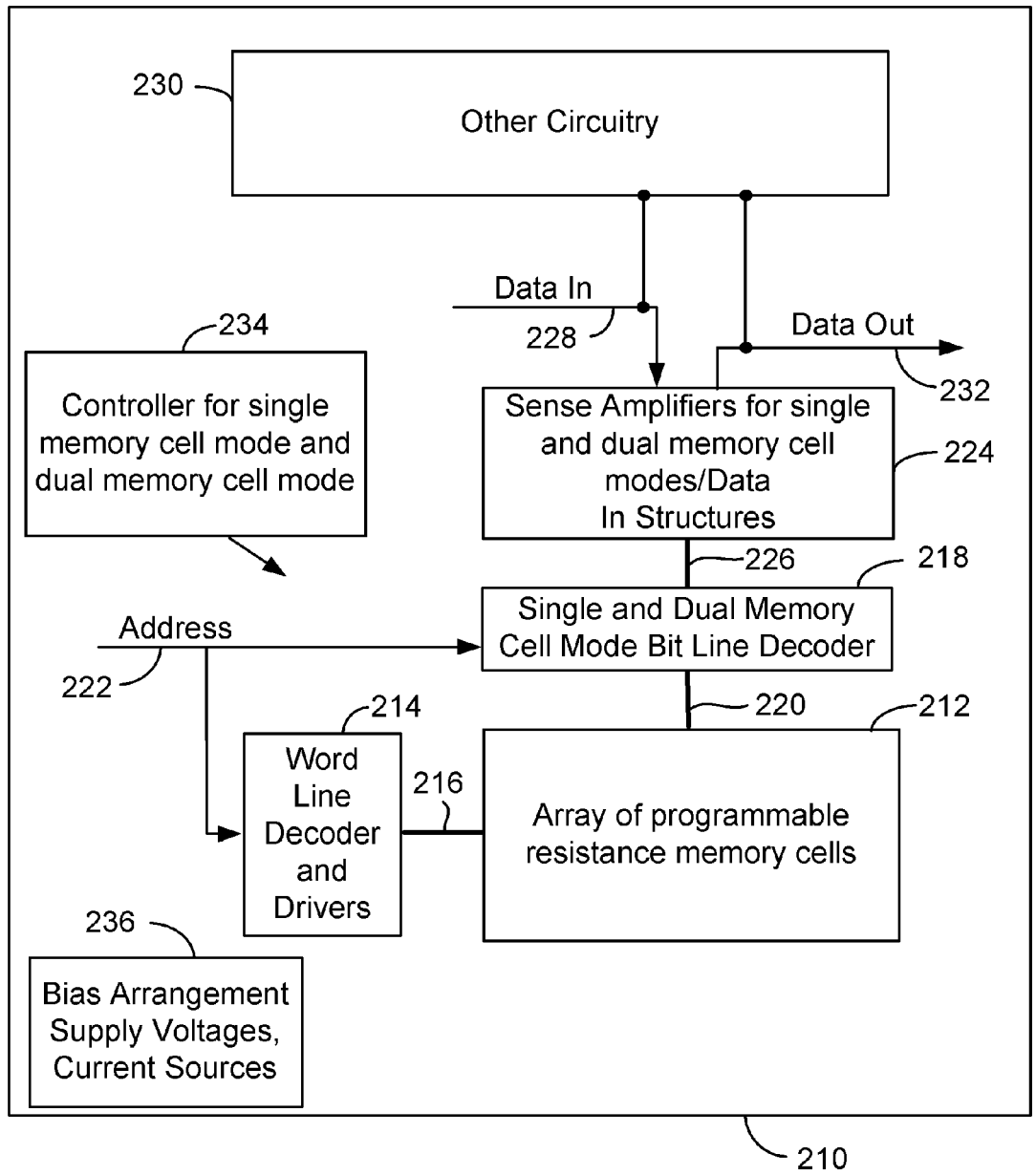
FIG. 2A is a block diagram of a first embodiment of an integrated circuit including a memory array of programmable resistance memory cells operated in single and dual modes as described herein.

FIG. 2A is a block diagram of a first embodiment of an integrated circuit 210 including a memory array 212 of programmable resistance memory cells. The memory cells include an access device such as a diode or transistor, and a programmable resistance memory element. As described in more detail below, the integrated circuit 210 is operable in a dual (2T-2R) mode to store a data value in a pair of memory cells in the array 212 based on a difference in resistance of a first memory cell in the pair and a second memory cell in the pair to provide high speed operation of memory cells in the array. The memory device is operable in a single (1T-1R) mode to store a data value in a particular memory cell in the array 212 based on the resistance of the particular memory cell to provide excellent nonvolatile data retention performance and higher memory density.

A word line decoder 214 is coupled to and in electrical communication with a plurality of word lines 216 arranged along rows in the memory array 212. A bit line (column) decoder 218 is in electrical communication with a plurality of bit lines 220 arranged along columns in the array 212 for operating the memory cells in array 212 in the single and dual modes. Addresses are supplied on bus 222 to word line decoder and drivers 214 and bit line decoder 218. Sense amplifiers and data-in structures in block 224, including sense amplifier circuitry for the single and dual modes, are coupled to bit line decoder 218 via data bus 226. Data is supplied via a data-in line 228 from input/output ports on integrated circuit 210, or from other data sources internal or external to integrated circuit 210, to data-in structures in block 224. Other circuitry 230 may be included on integrated circuit 210, such as a general purpose processor or special purpose application circuitry, or a combination of modules providing system-on-a-chip functionality supported by array 212. Data is supplied via a data-out line 232 from the sense amplifiers in block 224 to input/output ports on integrated circuit 210, or to other data destinations internal or external to integrated circuit 210.

A controller 234 implemented in this example, using a bias arrangement state machine, controls the application of bias arrangement supply voltages and current sources 236, to apply bias arrangements such read, program, erase, erase verify, program verify, and refresh to the memory cells of the array 212. The characteristics of the signals sent from the controller 234 to couple the bias arrangement supply voltages and current sources 236 determines the mode of operation (e.g. single or dual mode) as well as the operation (e.g. read, program, erase, etc.) to be performed to the memory cells of the array 212. The controller 234 also provides control signals to the bit line decoder 218 to couple the appropriate bit lines 220 to the inputs of the sense amplifiers of block 224 to operate the memory cells in the single and dual modes described below, and also provides control signals to block 224 to control the operation of the single and dual mode sense amplifiers during read operations.

Controller 234 may be implemented using special-purpose logic circuitry as known in the art. In alternative embodiments, controller 234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 234. In the dual mode, the controller 234 implements a refresh mode to periodically assess the memory cells to refresh the resistance of the corresponding memory elements to offset any change in resistance that may occur between refresh cycles on the memory cells.

In the embodiment illustrated in FIG. 2A, the bit line decoder 218 and the sense amplifiers of block 224 are operable in both modes, so that the memory cells within the array 212 can be operated in both modes.

Figure 2B:
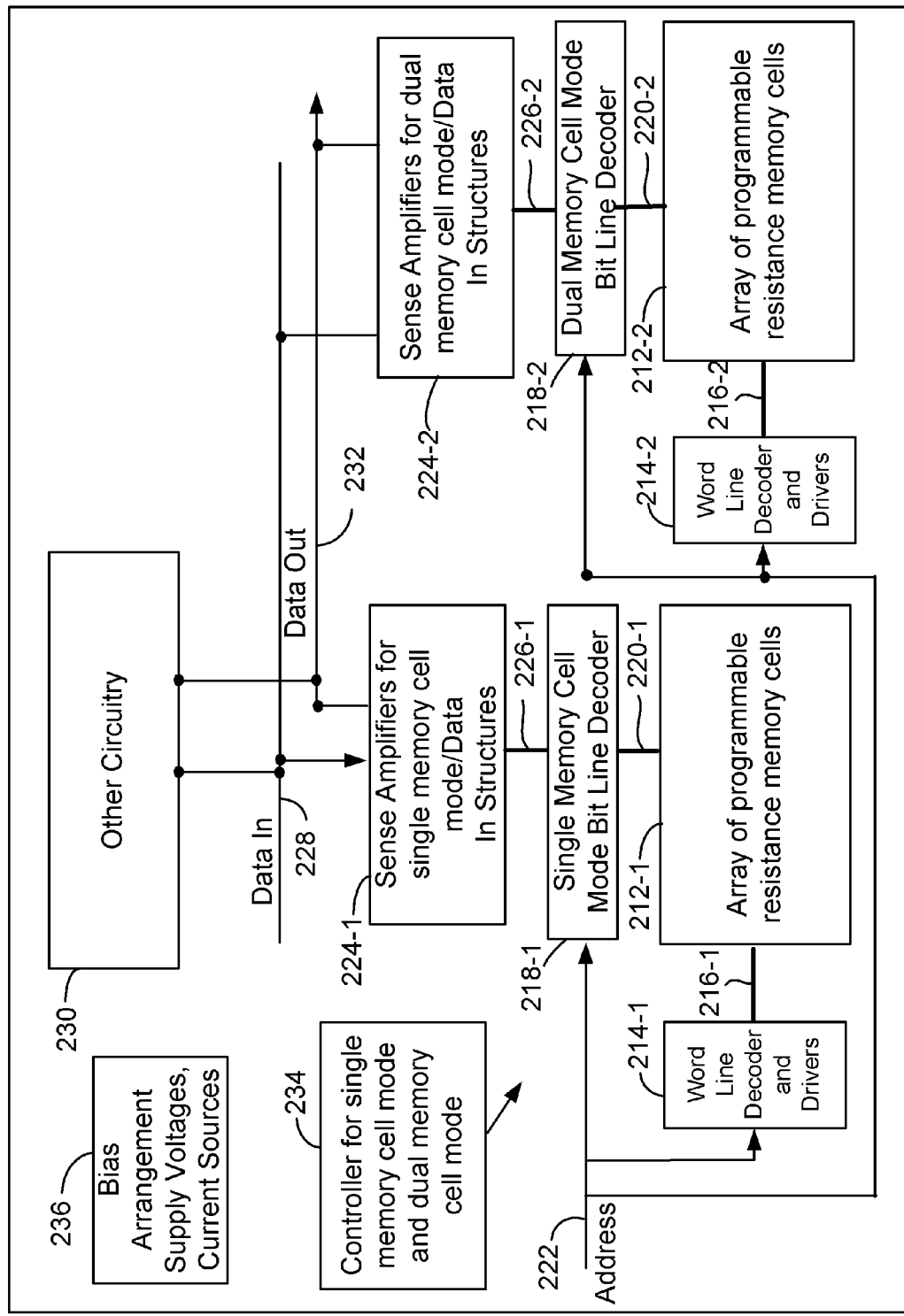
FIG. 2B is a block diagram of a second embodiment of an integrated circuit including programmable resistance memory cells operated in single and dual modes as described herein.

FIG. 2B is a block diagram of a second embodiment of an integrated circuit 310 operable in the single and dual modes. The integrated circuit 310 of FIG. 2B includes a single mode sense amplifiers of block 224-1 coupled to a single mode bit line decoder 218-1 via data bus 226-1. The single mode bit line decoder 218-1 is coupled to a first memory array 212-1 via bit lines 220-1, and word line decoder and drivers 214-1 is coupled to the first memory array 212-1 via word lines 216-1, so that the memory cells of the array 212-1 operate in the single mode. Dual mode sense amplifiers of block 224-2 is coupled to dual mode bit line decoder 218-2 via data bus 226-2. A second memory array 212-1 separate from the first memory array 212-1 is coupled to a dual mode bit line decoder 218-2 via bit lines 220-2, and coupled to word line decoder and drivers 214-2 via word lines 216-2, so that the cells in the second memory array 212-2 operate in the dual mode.

Figure 3A:
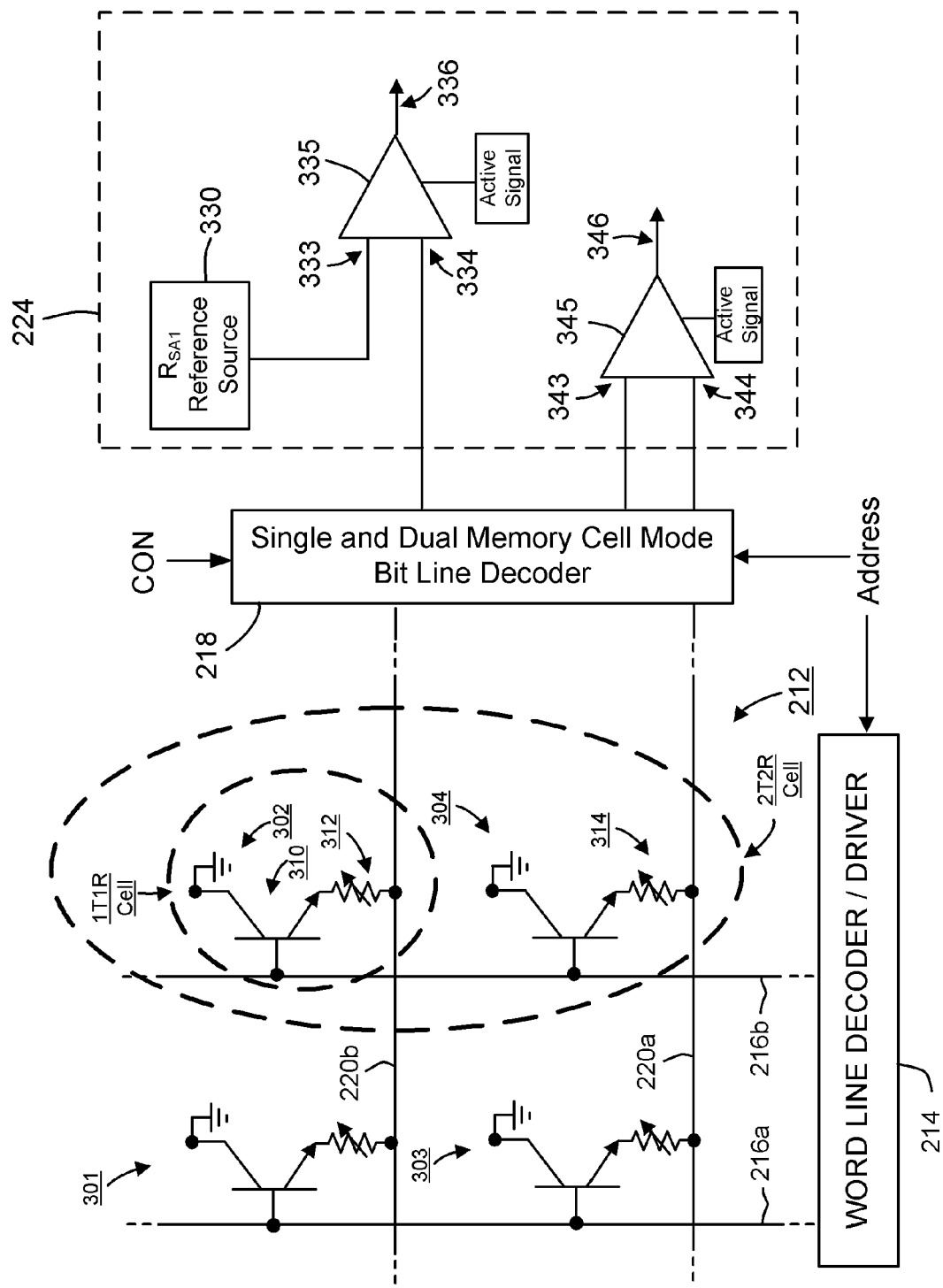
FIG. 3A illustrates a schematic diagram of an embodiment of the array of the integrated circuit of FIG. 2A.

FIG. 3A illustrates a schematic diagram of an embodiment of array 212 of the integrated circuit 210 of FIG. 2A. Each of the memory cells of the array 212 has a bipolar junction transistor, and a programmable resistance memory element represented as a variable resistor in the Figure. Instead of bipolar junction transistors, field effect transistors or diodes may be used as access devices in alternative embodiments.

Four memory cells 301-304 are illustrated in FIG. 3A, representing a small section of the array 212 that can include millions of memory cells. As described in more detail below, each memory cell in the array 212 can be operated in a single mode using the resistance of the corresponding memory element to store a data value, and can be operated as part as a pair of memory cells using the difference in the resistance of the corresponding memory elements of the pair of memory cells to store a data value.

A plurality of word lines 216 including word lines 216a, 216b extend in parallel in a first direction and are in electrical communication with word line decoder/driver 214. The word lines 216 are coupled to the base terminals of the bipolar junction transistors of the array 212.

A plurality of bit lines 220 including bit lines 220a, 220b extend in parallel in a second direction and are in electrical communication with bit line decoder 218. The emitter terminals of the respective bipolar junction transistors are coupled to a corresponding bit line 220 via the memory elements. Characteristics of the control signals CON sent from the controller 234 couple the appropriate bit lines 220 to the inputs of single and dual mode sense amplifiers 335, 345 of block 224.

The single mode sense amplifier 335 is responsive to the difference at the inputs 333 and 334 to generate an output signal 336 indicating the resistive state of the memory element of a selected memory cell and thus indicating the data value stored in a selected memory cell. The dual mode sense amplifier 345 is responsive to the difference at the inputs 343, 344 to generate an output signal 346 indicating the difference in resistance of the memory elements of a selected pair of memory cells, and thus indicating the data value stored in the selected pair of memory cells.

Figure 3B:
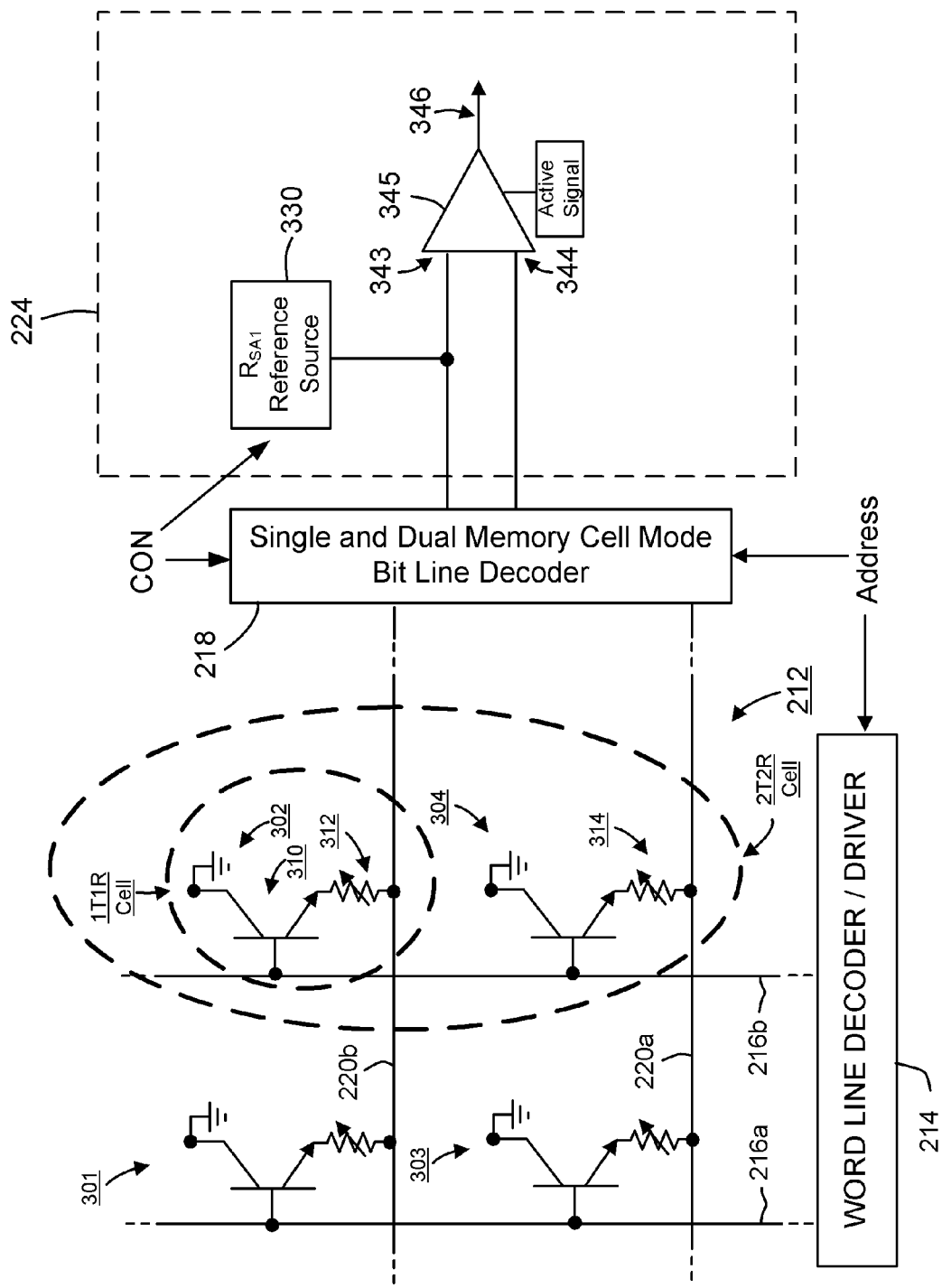
FIG. 3B illustrates a schematic diagram of a second embodiment of the integrated circuit of FIG. 2A.

FIG. 3B illustrates an alternative embodiment, in which the same sense amplifier 345 is used for both single and dual modes of operation. In FIG. 3B, the $RSA_1$ Reference Source 330 is responsive to the control signals CON sent from the controller 234 to selectively operate the reference source 330 to provide the reference current or voltage during single mode sensing.

In the illustrated embodiments the memory cells of the array 212 are coupled in a common collector configuration. In a common collector configuration, the collector terminals of the memory cells are coupled to a constant reference voltage, and the input and output are the base and emitter terminals respectively. Thus, in operation, voltages on the bit lines 220 and word lines 216 induce a current from the bit lines 220 to the collector terminals, or vice versa, through the emitter terminals and the memory elements. In FIGS. 3A and 3B the collector terminals are coupled to ground. Alternatively, the collector terminals may be coupled to a voltage source for applying a reference voltage other than ground.

In another embodiment the collectors of the access transistors are not electrically connected, but independently controllable. For example, the collectors may be coupled to bias circuits such as voltage sources and current sources, and decoding circuits for applying bias arrangements to the collector terminals.

It will be understood that the memory array 212 is not limited to the array configuration illustrated in FIG. 3A-3B, and other configurations can alternatively be used. Additionally, instead of bipolar junction transistors, field effect transistors or diodes may be used as access devices in alternative embodiments. Thus, although the modes are abbreviated as 2T-2R and 1T-1R herein, it will be understood that the abbreviations do not limit the access devices to transistors, and diodes can be used in embodiments.

Memory cell 302 is representative of the memory cells of the array 212 and comprises transistor 310 and memory element 312. Word line 216b is coupled to the base of transistor 310, and memory element 312 is arranged between the emitter of the transistor 310 and the bit line 220b.

As described in more detail below, the memory cell 302 is operated in a single mode using the resistance of the memory element 312 to store a data value. The memory cell 302 is also operated in a dual mode as part of a pair of memory cells 302, 304 using the difference in the resistance of the corresponding memory elements 312, 314 to store a data value.

Operation of the memory cell 302 can be by controller 234 controlling the application of bias arrangement supply voltages and current sources (See FIG. 2, reference number 236) for application of bias arrangements including bias arrangements for the single and dual modes of operation. The bias arrangements can include voltages and/or currents applied to the word lines 216 and bit lines 220. The level and duration of the voltages and/or currents applied is dependent upon the mode of operation, and also the operation performed, e.g. a reading operation or a writing operation. The levels and durations of the voltages and/or currents applied can be determined empirically for each embodiment. The various modes of operation are explained in more detail below.

Single Mode (1T-1R)

Figure 4:
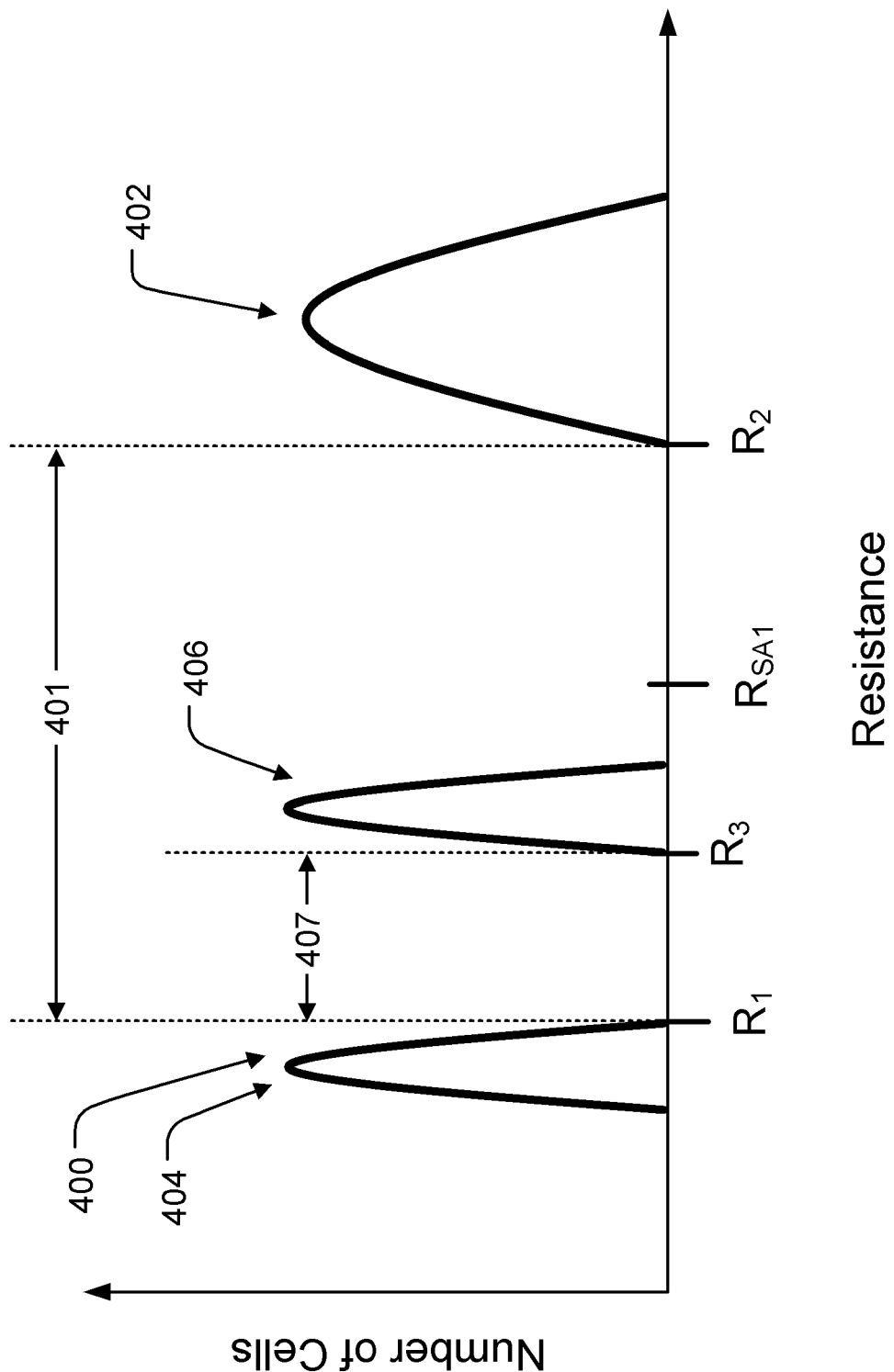
FIG. 4 is an example distribution for a number of memory cells, including resistance states for the single and dual modes.

In a reset (erase) operation of the memory cell 302, a reset pulse (or pulses) is (are) applied to the word line 216b and bit line 220b of suitable amplitude and duration to induce a current through the memory element 312 to cause a transition of an active region of the memory element 312 into an amorphous phase, thereby setting the phase change material to a resistance within a resistive value range associated with the single mode higher resistance reset state 402 as shown in FIG. 4. The reset pulse is a relatively high energy pulse, sufficient to raise the temperature of at least the active region of the memory element 312 and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of memory cell 302, a program pulse (or pulses) is (are) applied to the word line 216b and bit line 220b of suitable amplitude and duration to induce a current through the memory element 312 sufficient to raise the temperature of at least a portion of the active region above the transition temperature and cause a transition of at least a portion of the active region from the amorphous phase into the crystalline phase, this transition lowering the resistance of the memory element 312 and setting the resistance of the phase change material within a resistive value range associated with the single mode lower resistance set state 400 as shown in FIG. 4.

The difference between the highest resistance $R_1$ of the single mode lower resistance state 400 and the lower resistance $R_2$ of the single mode higher resistance reset state 402 defines a single mode read margin 401 used to distinguish cells in the lower resistance state 100 from those in the high resistance state 102. The single mode read margin 401 is relatively large in order to reliably distinguish between the single mode low and high resistance states 400, 402 by comparing the resistance of a particular memory cell with the reference. The relatively large single mode read margin 401 can therefore address issues such as variations in materials, manufacturing processes, and also the operating environment which lead to different programming characteristics including variations in the resistance of the memory material associated with each data value in an array of memory cells.

In a read (or sense) operation of the data value stored in the memory cell 302, a read pulse (or pulses) is (are) applied to the word line 216b and bit line 220b of suitable amplitude and duration to induce a current through the memory element 312 that does not result in the memory element 312 undergoing a change in resistive state. The current through the memory cell 302 is dependent upon the resistance of the memory element 312 and thus the data value stored in the memory cell 302.

In the read operation of memory cell 302, the bit line decoder 218 is responsive to control signals CON from controller 234 to couple the bit line 220b to the input 334 of the single mode sense amplifier 335. Thus, the data value stored in the memory cell 302 may be determined, for example, by comparison of the current on the bit line 220b with a current of an $R_{SA1}$ reference source 330 by single mode sense amplifier 335 of block 224. Other techniques can alternatively be used for determining the data value stored in memory cell 302 using the single mode sense amplifier 335. For example, the data value stored in memory cell 302 may be determined by comparing a discharged voltage on the bit line 220b with a reference voltage on a reference line, by comparing the response of the memory cell 302 to a fixed resistor having a resistive value $R_{SA1}$ between the high and low resistance states 400 and 402, or by comparing the response of the memory cell 302 to that of one or more reference cells.

The single mode sense amplifier 335 is responsive to the difference at the inputs 333 and 334 to generate an output signal 336 indicating the resistive state of the memory element 312 and thus indicating the data value stored in the memory cell 310.

In the illustrated embodiment the single mode sense amplifier 335 is shared among bit lines 220a and 220b. Alternatively, other configurations may be used. For example, each bit line 220 may be coupled to a dedicated single mode sense amplifier 335 during single mode operation.

Dual Mode (2T-2R)

The array 212 can also operate in a dual (serial) mode to store a data value in a pair of memory cells based on a difference in resistance of a first memory cell in the pair and a second memory cell in the pair. In the illustrated embodiment, memory cell 302 and memory cell 304 form a pair of memory cells during the dual mode of operation. For example, if the resistance of memory cell 302 is greater than the resistance of memory cell 304, the data value stored in the pair is "1". If the resistance of the memory cell 302 is less than the resistance of memory cell 304, the data value stored in the pair is "0". Alternatively, memory cell 302 may be paired with other memory cells in the array 212.

Reading or writing to the pair of memory cells 302, 304 can be achieved by applying appropriate voltages and/or currents to the corresponding word line 216b and bit lines 220a, 220b to induce a current through one or both of the memory elements 312, 314 of the memory cells 302, 304. The level and duration of the voltages/currents applied is dependent upon the operation performed.

In a program operation to store a first data value in the pair of memory cells 302, 304, the memory element 312 of the memory cell 302 is set to a resistance within a resistive value range associated with the dual mode lower resistance state 404, and the memory element 314 of the memory cell 304 is set to a resistance within a resistive value range associated with the dual mode higher resistance state 406. The first data value can be stored by setting the memory elements 312 and 314 to the appropriate states simultaneously by applying appropriate pulses to word line 216b and bit lines 220a, 220b, or can be stored by setting the memory elements 312 and 314 to the appropriate states one at a time.

In the illustrated embodiment the dual mode lower resistance state 404 and the single mode lower resistance state 400 correspond to the same resistive value range. Alternatively, the states 404 and 400 may correspond to different resistive value ranges.

In a program operation to store a second data value in the pair of memory cells 302, 304, the memory element 312 of the memory cell 302 is set to a resistance within a resistive value range associated with the dual mode higher resistance state 406, and the memory element 314 of the memory cell 304 is set to a resistance within a resistive value range associated with the dual mode lower resistance state 404. The second data value can be stored by setting the memory elements 312 and 314 to the appropriate states simultaneously by applying appropriate pulses to word line 216b and bit lines 220a, 220b, or can be stored by setting the memory elements 312 and 314 to the appropriate states one at a time.

Thus, during programming, the difference in the resistance of the memory elements 312 and 314 indicates the data value stored in the pair of memory cells 302, 304.

To achieve the different resistance values for the high resistance states 402 and 406 of the single and dual modes, respectively, different pulses in the single and dual modes are applied so that smaller active regions (e.g. less amorphous phase material) are established when operated in the dual mode than when operated in the single mode. Thus, during the single mode a first pulse is applied to provide a first amount of energy to establish the high resistance state 402, and during the dual mode a second pulse is applied to provide a second amount of energy to establish the high resistance state 406. In embodiments the second amount of energy can be less than the first amount of energy, for example by the second pulse having at least one of a pulse width and pulse height that is less than those of the first pulse.

As can be seen in FIG. 4, the difference 407 between the highest resistance $R_1$ of the dual mode lower resistance state 404 and the lower resistance $R_3$ of the dual mode higher resistance state 406 can be less than the single mode read margin 401. As a result, the time and/or energy needed to cause a transition in each memory cell of the pair between the dual mode low and high resistance states 404, 406 can be less than the time and/or energy needed to cause a transition between the single mode low and high resistance states 400, 402 in a single memory cell. Thus the dual mode operation allows for high speed operation using less programming current than the single mode operation.

Figure 5:
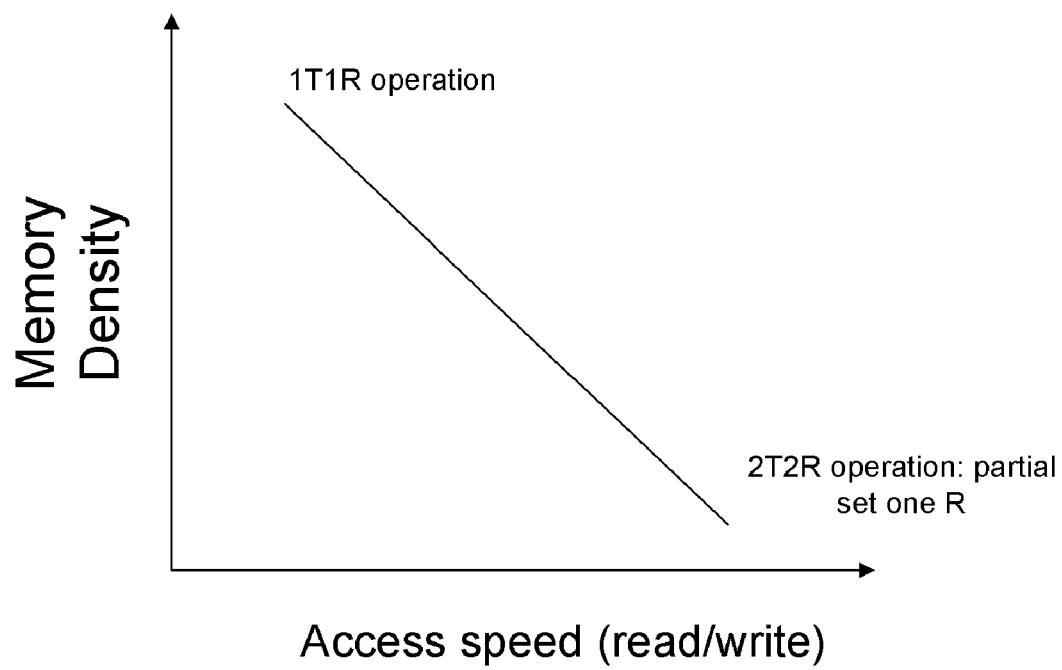
FIG. 5 is illustrates the relationship between memory density and access speed for the single and dual modes.

FIG. 5 illustrates the tradeoff between memory density and access speed for the single (1T1R) and dual (2T2R) modes. The single (1T1R) mode has a higher memory density because in the single (1T1R) mode a data value is stored using a single memory cell, while in the dual (2T2R) mode two memory cells are used to store a data value.

As noted above, the time and/or energy needed to cause a transition in each memory cell of the pair between the dual mode low and high resistance states 404, 406 can be less than the time and/or energy needed to cause a transition between the single mode low and high resistance states 400, 402 in a single memory cell. Thus, memory cells operated in the dual mode (2T2R) can provide a faster write access speed than memory cells operated in the single (1T1R) mode.

In addition, as described in more detail below, since a stored data value in the dual mode is determined based on the difference in resistance values between the pair of memory cells, rather than on the actual resistance values, memory cells operated in the dual mode can be read more quickly than those operated in the single mode. Thus, memory cells operated in the dual mode (2T2R) can provide a faster read access speed than memory cells operated in the single (1T1R) mode.

As a result, the single and dual modes can provide different operational characteristics to address the different memory performance requirements demanded by various functions of an integrated circuit.

In a read (or sense) operation of the data value stored in the pair of memory cells 302, 304, read pulses are applied to the word line 216b and bit lines 220a and 220b of suitable amplitude and duration to induce currents through the memory elements 314, 312 that do not result in the memory elements 314, 312 undergoing a change in resistive state. The respective currents through the memory elements 314 are dependent upon their respective resistances.

In the read operation of the pair of memory cells 302, 304, the bit line decoder 218 is responsive to the control signals CON to couple the bit line 220a to the input 344 and to couple the bit line 220b to the input 343 of the dual mode sense amplifier 335.

Thus, the data value stored in the pair of memory cells 302, 304 may be determined, for example, by comparison of the respective currents on the bit lines 220b and 220a by dual mode sense amplifier 345 of block 224. Other techniques can alternatively be used for determining the data value stored in the pair of memory cells 302, 304 using the dual mode sense amplifier 345. For example, the data value stored in the pair of memory cells 302, 304 may be determined by comparing a discharged voltage on the bit line 220a with a discharged voltage on the bit line 220b.

The dual mode sense amplifier 345 is responsive to the difference at the inputs 343, 344 to generate an output signal 346 indicating the difference in resistance of the memory elements 312 and 314, and thus indicating the data value stored in the pair of memory cells 302, 304.

Since the dual mode sense amplifier 345 is responsive to the difference in the resistances of the memory elements 312 and 314, rather than the actual resistance values, memory cells operated in the dual mode can be read more quickly than in the single mode.

In the single mode, the time required for the voltage or current at the input 334 to reach the reference value $R_{SA1}$, and cause a transition in the sense amplifier output 336, correlates with the resistance of the selected memory cell. Thus, for memory cells operated in the single mode, the read operation must be performed after a specified time within which the transition should have occurred.

In the dual mode, the dual mode sense amplifier 345 is responsive to a difference at the inputs 343, 344 to generate the output 346, and thus does not require the voltages or currents at the inputs 343, 344 to reach any particular reference value. Thus, the dual mode does not require a specified time like that required of the single mode. The data value stored in memory cells operated in the dual mode can thus be read more quickly than those operated in the single mode.

Refresh operations can be executed in embodiments suffering drift, in order to periodically assess the memory cells and refresh the resistance of the corresponding memory elements to offset any change in resistance that may occur between refresh cycles on the memory cells. The refresh operation may be performed by turning on the word lines 216 and bit lines 220 together during refresh checking.

It will be understood that pulses of the bias arrangements other than those discussed above can alternatively be used. More generally, the bias arrangements of each operation may comprise a set of one or more pulses. The number of pulses and the pulse shapes, including the voltage levels and pulse widths, of each bias arrangement can be determined empirically for each embodiment.

In addition, in embodiments some of the memory cells in the array may be operated in a single mode while others may concurrently be operated in a dual mode. The memory cells being operated in the single mode can be distinguished from those being operated in the dual mode by the addresses of the memory cells using, for example, a dynamic look-up table file stored in memory on the device. The look-up table can be written to and read by the controller to determine the appropriate characteristics of the control signals sent to operate the bit line decoder and the sense amplifiers.

FIGS. 6A-6E show representative prior art memory cell structures which may be implemented in the memory cells of the array.

Figure 6A:
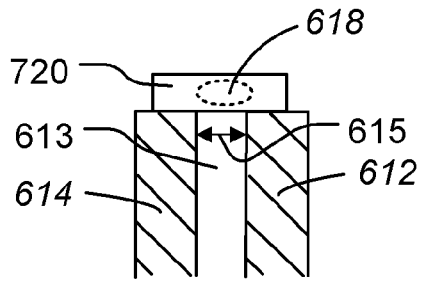
FIGS. 6A-6E show representative prior art memory cell configurations which may be implemented in the memory cell array described herein.

FIG. 6A is a simplified cross-sectional view illustrating a first configuration for memory element 720 coupled to first and second electrodes 612, 614. The first electrode 612 may, for example, be coupled to a terminal of an access device such as a diode or transistor, while the second electrode 614 may be coupled to a bit line.

A dielectric spacer 613 having a width 615 separates the first and second electrodes 612, 614. The phase change material of memory element 720 extends across the dielectric spacer 613 and contacts the first and second electrodes 612, 614, thereby defining an inter-electrode path between the first and second electrodes 612, 614 having a path length defined by the width 615 of the dielectric spacer 613. In operation, as current passes between the first and second electrodes 612, 614 and through the memory element 720, the active region 618 of the phase change material of the memory element 720 heats up more quickly than the remainder of the memory element 720.

Figure 6B:
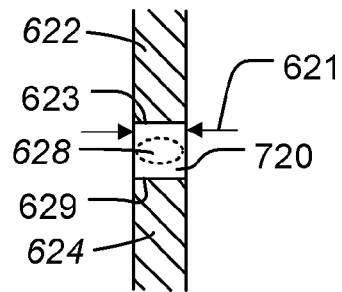

FIG. 6B is a simplified cross-sectional view illustrating a second configuration for memory element 720 coupled to first and second electrodes 622, 624. The phase change material of the memory element 720 has an active region 628 and contacts the first and second electrodes 622, 624 at top and bottom surfaces 623, 629 respectively. The memory element 720 has a width 621 the same as that of the first and second electrodes 622, 624.

Figure 6C:
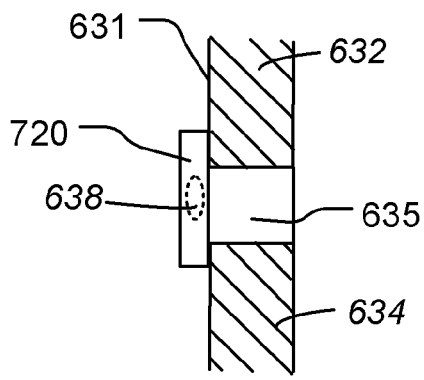

FIG. 6C is a simplified cross-sectional view illustrating a third configuration for memory element 720 coupled to first and second electrodes 632, 634, the phase change material of memory element 720 having an active region 638. The first and second electrodes 632, 634 are separated by dielectric spacer 635. The first and second electrodes 632, 634 and the dielectric spacer 635 have a sidewall surface 631. The phase change material of memory element 720 is on the sidewall surface 631 and extends across the dielectric spacer 635 to contact the first and second electrodes 632, 634.

Figure 6D:
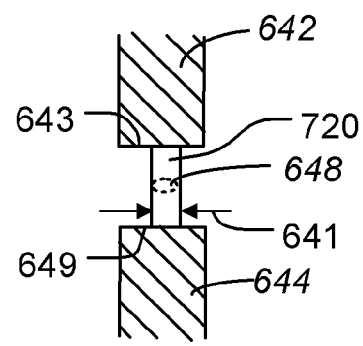

FIG. 6D is a simplified cross-sectional view illustrating a fourth configuration for memory element 720 coupled to first and second electrodes 642, 644. The phase change material of memory element 720 has an active region 648 and contacts the first and second electrodes 642, 644 at top and bottom surfaces 643, 649 respectively. The memory element 720 has a width 641 less than that of the first and second electrodes 642, 644.

Figure 6E:
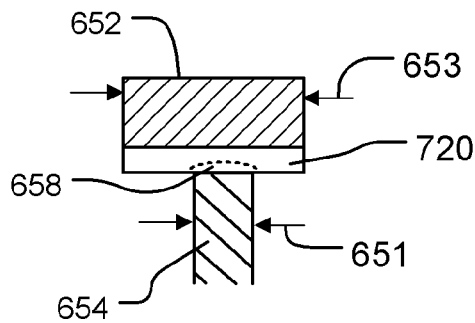

FIG. 6E is a simplified cross-sectional view illustrating a fifth configuration for memory element 720 coupled to first and second electrodes 654, 652. The first electrode 654 has a width 651 less than width 653 of the second electrode 652 and memory element 720. Because of the difference between width 651 and width 653, in operation the current density in the phase change material of memory element 720 is largest in the region adjacent the first electrode 654, resulting in the active region 658 having a "mushroom" shape as shown in the Figure.

Embodiments of the memory cells described herein include phase change based memory materials, including chalcogenide based materials and other materials, for the programmable resistance memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge^b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2 Sb_2 Te_5$, $GeSb_2 Te_4$ and $GeSb_4 Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

In order to meet the requirements of high performance RRAM, phase change memory elements must operate at very high set and reset speeds and use less programming current. This means the memory window will be small and the data retention will be worse. The devices and methods described herein having single and dual modes provide a phase change memory array structure which can operate at high speeds and also can provide excellent data retention characteristics. The memory cells in the array can operate in the dual mode to provide fast speed high performance (serial operation). In order to save memory size, memory cells in the array can also operate in the single mode when lower speed full random access operation is required. In embodiments, some of the memory cells in the array may be operated in a single mode while others may concurrently be operated in a dual mode.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. A memory device comprising:
an array of programmable resistance memory cells; and
sense circuitry having a single mode to read a first data value stored in a particular memory cell in the array in dependence upon a resistance of the particular memory cell, and having a dual mode to read a second data value stored in a pair of memory cells in the array in dependence upon a difference in resistance between a first memory cell in the pair and a second memory cell in the pair.

2. The device of claim 1, wherein the pair of memory cells includes said particular memory cell.

3. The device of claim 1, wherein:
the single mode reads the first data value stored in the particular memory cell by determining whether the resistance of the particular memory cell is greater than or less than a predetermined reference value; and
the dual mode reads the data value stored in the pair of memory cells by determining whether the resistance of the first memory cell is greater than or less than the resistance of the second memory cell.

4. The device of claim 1, wherein:
the first data value corresponds to a single mode lower resistance state in the particular memory cell, or corresponds to a single mode higher resistance state in the particular memory cell; and
the second data value corresponds to a dual mode lower resistance state in the first memory cell in the pair and a dual mode higher resistance state in the second memory cell in the pair, or corresponds to the dual mode higher resistance state in the first memory cell in the pair and the dual mode lower resistance state in the second memory cell in the pair.

5. The device of claim 4, wherein the dual mode high resistance state has a minimum resistance less than a minimum resistance of the single mode high resistance state.

6. The device of claim 4, wherein the low resistance states of the dual mode and the single mode correspond to the same resistance range.

7. The device of claim 4, further comprising bias circuitry having single and dual modes to establish the higher and lower resistance states in the memory cells, the bias circuitry in the single mode applying a first pulse to the particular memory cell to establish the single mode higher resistance state, and the bias circuitry in the dual mode applying a second pulse to one of the first and second memory cells to establish the dual mode higher resistance state, the second pulse having a pulse width different from that of the first pulse.

8. The device of claim 7, wherein the second pulse has a pulse height different from that of the first pulse.

9. The device of claim 1, wherein the array of programmable resistance memory cells includes phase change memory cells.

10. The device of claim 1, wherein:
in the single mode the sense circuitry is coupled to a reference source and coupled to the particular memory cell, the sense circuitry responsive to a difference in resistance between the particular memory cell and the reference source; and
in the dual mode the sense circuitry is coupled to the first memory cell in the pair and to the second memory cell in the pair, the sense circuitry responsive to a difference in resistance between the first and second memory cells in the pair.

11. A method for operating a memory device comprising an array of programmable resistance memory cells and sense circuitry coupled to the array, the method comprising:
operating the sense circuitry in a single mode to read a first data value stored in a particular memory cell in the array in dependence upon a resistance of the particular memory cell; and
operating the sense circuitry in a dual mode to read a second data value stored in a pair of memory cells in the array in dependence upon a difference in resistance between memory cells in the pair.

12. The method of claim 11, wherein the pair of memory cells includes said particular memory cell.

13. The method of claim 11, wherein:
reading the first data value stored in the particular memory cell comprises determining whether the resistance of the particular memory cell is greater than or less than a predetermined reference value; and
reading the second data value stored in the pair of memory cells comprises determining whether the resistance of the first memory cell is greater than or less than the resistance of the second memory cell.

14. The method of claim 11, wherein:
the first data value corresponds to a single mode lower resistance state in the particular memory cell, or to a single mode higher resistance state in the particular memory cell; and
the second data value corresponds to a dual mode lower resistance state in the first memory cell in the pair and a dual mode higher resistance state in the second memory cell in the pair, or to the dual mode higher resistance state in the first memory cell in the pair and the dual mode lower resistance state in the second memory cell in the pair.

15. The method of claim 14, wherein the dual mode higher resistance state has a minimum resistance less than a minimum resistance of the single mode higher resistance state.

16. The method of claim 14, wherein the dual mode higher resistance state has a minimum resistance less than a minimum resistance of the single mode higher resistance state.

17. The method of claim 14, wherein the memory device further comprises bias circuitry having single and dual modes to establish the higher and lower resistance states in the memory cells, the method further comprising:
operating the bias circuitry in the single mode to apply a first pulse to the particular memory cell to establish the single mode higher resistance state; and
operating the bias circuitry in the dual mode to apply a second pulse to one of the first and second memory cells to establish the dual mode higher resistance state, the second pulse having a pulse width different from that of the first pulse.

18. The method of claim 17, wherein the second pulse has a pulse height different from that of the first pulse.

19. The method of claim 11, wherein the programmable resistance memory cells includes phase change memory cells.

20. The method of claim 11, wherein:
operating the sense circuitry in the single mode comprises:
coupling a reference source to the sense circuitry;
coupling the particular memory cell to the sense circuitry; and
generating an output signal of the sense circuitry indicating the data value stored in the particular memory cell in dependence upon a difference in resistance between the particular memory cell and the reference source; and
operating the sense circuitry in the dual mode comprises:
coupling a first memory cell in the pair to the sense circuitry;
coupling a second memory cell in the pair to the sense circuitry; and
generating an output signal of the sense circuitry indicating the data value stored in the pair of memory cells in dependence upon a difference in resistance between the first and second memory cells in the pair.

* * * * *